United States Patent Office 3,674,520

Patented July 4, 1972

3,674,520

SOLDER GLASS FOR ADHERING, SEALING OR COATING

Yoshiro Suzuki and Shigehiro Nagahara, Tokyo, and Nobuyoshi Ichimura, Yokohama, Japan, assignors to Asahi Glass Company Limited, Tokyo, Japan No Drawing. Filed Sept. 17, 1970, Ser. No. 73,212
Claims priority, application Japan, Sept. 27, 1969, 44/76,701
Int. Cl. C03c 3/04, 3/08, 5/00
U.S. Cl. 106—54 1 Claim

ABSTRACT OF THE DISCLOSURE

A solder glass suitable for adhering, sealing and coating a shaped refractory or semiconductor device, which contains by weight, ZnO 60–68%; $B_2O_3$ 20–30%, $SiO_2$ 8–11%, and $SnO_2$ 0.1–3.0%; and which preferably further contains one or more of PbO 0–6%, $Sb_2O_3$ 0–0.8%, $As_2O_3$ 0–0.5%, $CeO_2$ 0–1.5%, $Ta_2O_5$ 0–1.0%, and/or $Nb_2O_5$ 0–1.0%.

The solder glass of this invention is characterized by a remarkably low coefficient of thermal expansion and which is capable of protecting a semiconductor device.

BACKGROUND OF THE INVENTION

Field of the invention

This invention relates to solder glass compositions suitable for sealing, adhering and coating shaped refractory or semiconductor devices such as preformed bodies made of glass, metal or ceramic and having a coefficient of thermal expansion of about $40–50\times10^{-7}/°$ C., such as silicon diodes.

Description of the prior art

Semiconductor elements are frequently subjected to a wide variety of injurious materials, such as corrosive agents, corrosive vapors and moisture, which can deleteriously affect the electrical characteristics of the elements. Accordingly, it is important that the diode or transistor surfaces around any exposed junctions, be carefully protected so as to maintain the desired electrical characteristics and operational procession. One technique for protecting these surfaces is to form an oxide layer over the surface of the silicon semiconductor. Other known techniques include encapsulating the device in various plastics, oxides, low melting point chalcogenide type glasses, high lead silicate type glasses, zinc-borosilicate type glasses or the like. Although these prior art techniques have been found to be somewhat effective for protecting P-N junctions, it has been difficult obtaining a high degree of reliability for all applicants. Moreover, the state of the art encapsulating techniques usually result in the formation of an undesirable voluminous product.

Another disadvantage of using glasses for protecting the semiconductor device, is that they frequently can cause alterations in the electrical potential around the exposed junction or they can penetrate into the semiconductor to cause undesirable changes in its electrical characteristics. For instance, it is known that low melting point chalcogenide type glasses, boro-silicate type glasses, zinc-silicate type glasses and high lead content borosilicate type glasses can be used as a coating material for encapsulating semiconductor devices. However, none of these glasses have been successfully used on a commercial scale. The chalcogenide type glasses are characterized by an undesirably high coefficient of thermal expansion and an undesirably high toxicity; the boro-silicate glasses provide undesirable P-N junction and surface electrical characteristics due to the liberation of boron; the zinc borosilicate glasses are characterized by suitable chemical resistance and suitable coefficient of thermal expansion, however, their breakdown voltage characteristics are unreliable; the lead silicate glasses are characterized by good durability, but it is difficult to form a suitable film since their coefficients of thermal expansion are significantly higher than those of most semiconductors.

SUMMARY OF THE INVENTION

Accordingly, it is one object of this invention to provide a solder glass which can be used for coating a semiconductor device or other preformed refractory body.

Another object of this invention is to provide a chemically stable solder glass which can be directly applied to a semiconductor device or preformed refractory body and which is capable of protecting the surfaces around any exposed junctions.

These and other objects have now herein been attained by the use of a solder glass having the following composition by weight, as calculated from batch preparation:

| | Percent |
|---|---|
| ZnO | 60–68 |
| $B_2O_3$ | 20–30 |
| $SiO_2$ | 8–11 |
| $SnO_2$ | 0.1–3.0 |
| PbO | 0–6.0 |
| $Sb_2O_3$ | 0–0.8 |
| $As_2O_3$ | 0–0.5 |
| $CeO_2$ | 0–1.5 |
| $Ta_2O_5$ | 0–1.0 |
| $Nb_2O_5$ | 0–1.0 |

DETAILED DESCRIPTION OF PREFERRED EMBODIMENT

In order to encapsulate a semiconductor device with a solder glass it is preferable to use a temperature of less than 750° C. which is applied over a very short time period. At the application temperature, the glass must be sufficiently fluid and preferably should be in a vitreous condition. The coefficient of thermal expansion should be similar to that of the semi-conductor body on the electrode material which is usually Mo, W, Kovar, etc. This means that the coefficient of thermal expansion should be in the range of from $40\times10^{-7}/°$ C. to $50\times10^{-7}/°$ C., at the temperature range of 50–350° C.

Since for silicon diodes it is desirable to coat the glass directly onto the substrate without the prior formation of an intermediate protective layer, such as silicon dioxide, the glass contacting the semiconductor element should have suitable chemical stability and should be capable of providing a suitable hermetic seal.

It has been found that the solder glass, above described, is capable of achieving all of the above requirements. In that composition, only the ZnO, $B_2O_3$, $SiO_2$ and $SnO_2$ are indispensible elements, all of the other elements are optional ingredients. The more preferable ranges of these indispensible elements are ZnO, 61–63%; $B_2O_3$, 22–23%; $SiO_2$, 9–9.5%; and $SnO_2$, 0.5–1.5%.

When the ZnO content is less than 60%, it may be difficult to obtain a homogeneous glass. If the ZnO content is greater than 68%, the rate of devitrification of the solder glass may be too high. Where the $B_2O_3$ content is less than 20% or more than 30%, a homogeneous glass may not be obtainable. Where the $SiO_2$ content is less than 8%, the coefficient of thermal expansion of the solder glass may become to high and the chemical resistance of the composition of the solder glass may be undesirably low. Also the temperature of thermal devitrification may be undesirably lowered. If the composition contains more than 11% $SiO_2$, melting of the glass may be difficult and the sealing temperature of the solder glass may be too high.

The $SnO_2$ is the most important component of the composition as will be discussed in greater detail below. Where the $SnO_2$ content is less than 0.1%, the desired effects of this invention will not be obtained, whereas if the quantity of $SnO_2$ is greater than 3%, it may be difficult to obtain a homogeneous glass.

The PbO, $Sb_2O_3$, $CeO_2$, $Ta_2O_5$ or $Nb_2O_5$ may be used to increase the effects of the $SnO_2$ and to improve melting and refining properties of the glass. From the point of view of glass melting, it is preferable to use PbO and/or $Sb_2O_3$, however, when PbO is used, it is important that its content in the composition be less than 6% and that no reduction to a lower valence state occurs. This can be accomplished by coating and sealing the glass in a nitrogen atmosphere.

A small amount of $Al_2O$, or other alkaline earth metal oxide such as BaO or MgO may be contained in the composition, however, it is preferable to avoid alkali metal oxide or copper-oxide contamination, since the ions of these compounds are easily diffusible into the semiconductor element, which can result in an electrical short.

Where a transition metal oxide, such as $SnO_2$ is added to zinc-borosilicate glass compositions, preferably together with a small amount of PbO, $Sb_2O_3$, $Ta_2O_5$ or $NbO_5$, a semiconductor device can be fabricated which can withstand high reverse voltages and which is characterized by excellent electrical characteristics. The reason why the transition metal oxide has this effect is not clear, however, it is believed that it serves to prevent the formation of impurities, such as boron or the like, which can affect the conductivity near the surface of the semiconductor. This effect is believed to be somehow related to the fact that the transition metal oxide in the glass can change the valency states.

The adhesive or bonding strength of the glass to the semiconductor is greatly improved, and it is believed that this is due to the ability of the transition metal oxide to oxidize the surface of the semiconductor material during subsequent heat treatment.

In order to prepare the solder glasses of this invention, the raw metal oxides or oxide containing materials are mixed in the appropriate proportions and are molten in an oxide resistant crucible, such as platinum, for about one hour at 1200° C.–1300° C. The resulting molten glass is quenched between water cooling metal rollers and is formed into a flaky solid. The glass is crushed into a fine powder having an average diameter of 4–8$\mu$ in a ball mill.

The crushed glass powder is mixed with a liquid vehicle such as a pure water which has been prepared by ion exchanging with ethanol, nitrocellulose, amylacetate or butyl carbitol. The resulting slurry is then used for coating the semiconductor or refractory device by conventional coating processes. The coated semiconductor device is dried and heated for an appropriate time to volatilize a liquid vehicle and the glass is fluidized to yield a uniform glass coating.

The solder glass according to this invention can be generally used in a vitreous state, however, if desired, it can also be used in the devitrified state. It is important that the glass be given a heat treatment which comprises heating the glass to a temperature of from 660–740° C. for 5–10 minutes if the solder glass is used in its vitreous state or heating the glass to a temperature of from 700–800° C. for 20–60 minutes if the glass is used in its devitrified state.

In the latter case, the solder glass is fluidized to uniformly cover a product, and then is hardened by devitrification. During the thermal treatment, crystals of substantially $\alpha$-zinc borate ($\alpha$-$ZnO.B_2O_3$), Willemite ($2ZnO.SiO_2$) are formed to produce a matte.

The devitrified glass has an exceptionally low coefficient of thermal expansion as well as excellent water resistance and chemical durability.

For example, the Sample 11 of solder glass of this invention stated in Tables 1 and 2 has a coefficient of linear thermal expansion of $46.3\times10^{-7}/°$ C., and a weight loss of 0.12 wt. percent when submerged in water at 98° C. for one hour.

If the devitrified glass is heated at 760° C. for 60 minutes the coefficient of linear thermal expansion is $36.8\times10^{-7}/°$ C. and the weight loss is 0.07 wt. percent.

It is desirable to raise the heat treatment for some type of application. Having generally described the invention, a further understanding can be obtained by reference to certain specific examples which are provided herein for purposes of illustration only and are not intended to be limiting in any manner.

Each solder glass having the compositions shown in Table 1 is produced in accordance with the above mentioned process. The linear thermal expansion coefficient and transformation point of each glass was measured, and is shown in Table 1.

The coefficient of linear thermal expansion and the water resistance of each solder glass in their vitreous and devitrified states was measured and are shown comparatively in Table 2. Water resistance is shown as weight loss (wt. percent) caused by submerging each sample of 5 g. (average diameter is 0.3–0.5 mm), in water at 98° C. for one hour.

TABLE I

| | Sample | | | | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| Proportions of compositions (weight percent)—Component: | | | | | | | | | | | | | | | | |
| ZnO | 62.0 | 62.0 | 62.5 | 62.0 | 66.0 | 61.0 | 62.0 | 61.5 | 62.0 | 62.0 | 62.0 | 63.0 | 64.0 | 62.0 | 61.0 | 63.0 |
| $B_2O_3$ | 26.0 | 28.0 | 27.0 | 27.0 | 23.5 | 27.0 | 26.5 | 24.0 | 26.0 | 26.0 | 23.0 | 23.1 | 23.2 | 22.5 | 23.0 | 25.5 |
| $SiO_2$ | 9.0 | 9.0 | 10.0 | 10.0 | 9.5 | 10.0 | 10.0 | 9.0 | 9.0 | 9.0 | 9.5 | 9.5 | 9.5 | 9.5 | 9.5 | 9.0 |
| $SnO_2$ | 3.0 | 1.0 | 0.5 | 1.0 | 1.0 | 1.0 | 1.0 | 0.5 | 2.0 | 2.0 | 0.5 | 2.0 | 2.0 | 1.5 | 1.5 | 1.0 |
| PbO | | | | | | | | 5.0 | | | 4.0 | 2.0 | | 4.0 | 4.0 | |
| $As_2O_3$ | | | | | | | 0.5 | | | | | | | | | |
| $Ta_2O_5$ | | | | | | | | | 1.0 | | | | | | | |
| $Nb_2O_5$ | | | | | | | | | | 1.0 | | | | | | |
| $Sb_2O_3$ | | | | | | | | | | | | 0.4 | 0.8 | 0.5 | 0.5 | |
| $CeO_2$ | | | | | | | | | | | 1.0 | | 0.5 | 0.5 | 0.5 | |
| $Al_2O_3$ | | | | | | | | | | | | | | | | 0.5 |
| Thermal expansion coefficient$\times10^{-7}$ ° C. (50–350° C.) | 47.0 | 46.2 | 46.5 | 46.9 | 49.6 | 47.4 | 47.5 | 46.1 | 47.0 | 47.5 | 46.3 | 44.9 | 47.0 | 46.3 | 45.3 | 48.0 |
| Transformation point (° C.) | 559 | 567 | 570 | 569 | 561 | 578 | 568 | 563 | 559 | 562 | 554 | 565 | 562 | 556 | 552 | 557 |

TABLE 2

| Sample | Thermal treatment, ° C. | | Thermal expansion coefficient ($\times10^{-7}/°$ C.) | | Water resistance (wt. percent) | |
|---|---|---|---|---|---|---|
| | Vitreous state (5-10 min.) | Devitrified state (60 min.) | Vitreous state | Devitrified state | Vitreous state | Devitrified state |
| 11 | 600–740 | 760 | 46.3 | 36.8 | 0.12 | 0.07 |
| 14 | 600–740 | 700 | 46.3 | 45.0 | 0.21 | 0.09 |
| 15 | 600–740 | 730 | 45.8 | 40.7 | | |

The solder glasses shown in Tables 1 and 2 are seen to have a coefficient of linear thermal expansion of about $40–50\times10^{-7}/°$ C. and can form an adequate film on a silicon diode to provide excellent electrical characteristics. The glass can be applied, by means of conventional coating processes, to a semiconductor device, even a semiconductor device which has an intermediate layer of silicon dioxide. Each component of the solder glass of this invention can be modified within the specified ranges to obtain the appropriate coefficient of thermal expansion and transformation point, depending upon the particular material being encapsulated.

Although the present invention has been discussed primarily in terms of using the solder glass to form a protecting glass layer on silicon diodes, it should be clearly understood that the solder glass can equally be used for adhering, sealing or coating other glasses, metals and ceramics.

Accordingly, it will be apparent to one of ordinary skill in the art that many changes and modifications can be made without departing from the spirit or scope of the invention.

What is claimed is:

1. A solder glass for encapsulating semiconductors which reduces the incidence of reverse voltage breakdown of said semiconductors consisting essentially of:

| | Percent weight |
|---|---|
| ZnO | 60–68 |
| $B_2O_3$ | 20–30 |
| $SiO_2$ | 8–11 |
| $SnO_2$ | 0.1–3.0 |
| PbO | 0–6.0 |
| $Sb_2O_3$ | 0–0.8 |
| $As_2O_3$ | 0–0.5 |
| $CeO_2$ | 0–1.5 |
| $Ta_2O_5$ | 0–1.0 |
| $Nb_2O_5$ | 0–1.0 |

wherein the thermal expansion of said glass is between 40 to $50\times10^{-7}/°$ C. within the temperature range of 50–350° C.

References Cited

UNITED STATES PATENTS

| | | | |
|---|---|---|---|
| 3,113,878 | 12/1963 | Martin | 106—39 DV |
| 3,117,881 | 1/1964 | Henry et al. | 106—39 |
| 3,300,670 | 1/1967 | Veres | 106—39 DV |
| 3,462,252 | 8/1969 | Veres | 106—39 DV |
| 3,505,571 | 4/1970 | De Volder | 106—54 |

TOBIAS E. LEVOW, Primary Examiner

M. L. BELL, Assistant Examiner

U.S. Cl. X.R.

106—39 DV, 48